United States Patent [19]

van der Put

[11] Patent Number: 4,685,097

[45] Date of Patent: Aug. 4, 1987

[54] POWER CONTROL SYSTEM FOR A SEMICONDUCTOR LASER

[75] Inventor: Henk A. van der Put, Colorado Springs, Colo.

[73] Assignee: Laser Magnetic Storage International Company, Colorado Springs, Colo.

[21] Appl. No.: 758,902

[22] Filed: Jul. 25, 1985

[51] Int. Cl.$^4$ .............................................. G11B 7/00
[52] U.S. Cl. ...................................... 369/54; 369/122; 346/76 L; 346/135.1
[58] Field of Search ...................... 369/53, 54, 55, 121, 369/122; 346/76 L, 135.1; 331/94.1; 455/609, 611

[56] References Cited

U.S. PATENT DOCUMENTS

| | | | |
|---|---|---|---|
| 4,122,409 | 10/1978 | Marlett et al. | 331/94.5 M |
| 4,166,985 | 9/1979 | White et al. | 331/94.5 S |
| 4,277,846 | 7/1981 | Chen | 455/611 |
| 4,307,469 | 12/1981 | Casper et al. | 455/613 |
| 4,319,203 | 3/1982 | Brosio et al. | 372/30 |
| 4,328,506 | 3/1982 | Yoshida et al. | 346/76 L |
| 4,399,566 | 8/1983 | Roullet et al. | 455/613 |

Primary Examiner—Robert L. Richardson
Attorney, Agent, or Firm—Sheridan, Ross & McIntosh

[57] ABSTRACT

In an optical recording system employing a semiconductor diode laser and having both read and write capabilities, the laser power must be carefully controlled at both the appropriate level for reading and at a different level for writing. Typically, a continuous read beam is emitted by the laser while pulses at the higher write power level are generated. The laser power control loop of the present disclosure maintains both the read and write output power of the laser within predetermined limits. A light sensing diode is used to determine laser output power, which is then used to operate the control circuit by adjusting the read and write current supplied to the laser. The output of the sensing diode voltage is passed through a read/write switch which is controlled by write pulses, which also control the laser. In read mode a DC signal is sent to a quad comparator circuit for read power control. In write mode a pulsed signal is sent to a sample and hold circuit which output goes through an amplifier to another quad comparator circuit for write power control.

10 Claims, 4 Drawing Figures

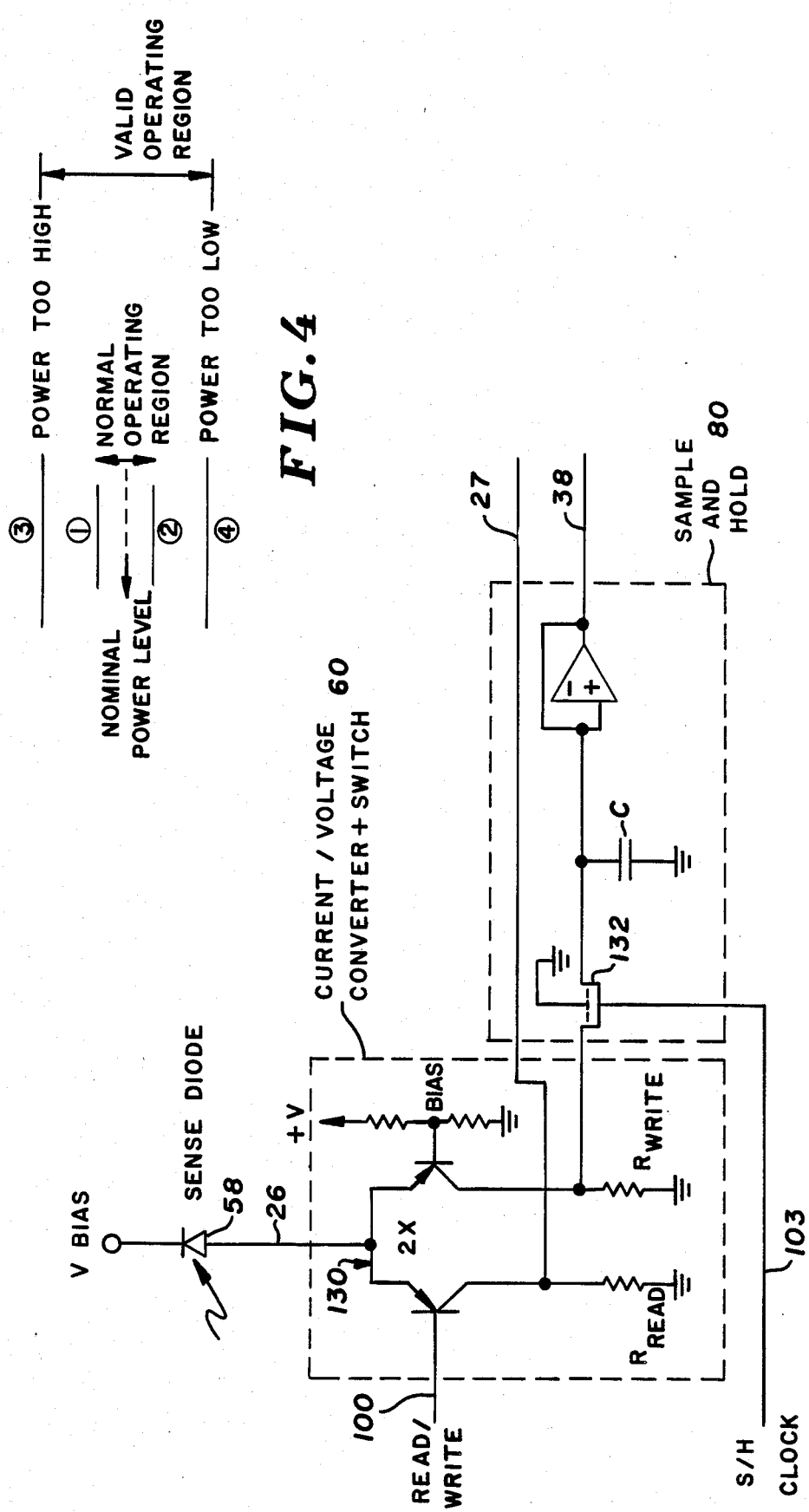

POWER CONTROL SYSTEM FOR A SEMICONDUCTOR LASER

CROSS REFERENCE TO RELATED APPLICATIONS

The present inventor is a coinventor of patent application Ser. No. 720,218 filed Apr. 5, 1985 and assigned to Optical Storage International, a general partnership of New York, the same assignee as the present application. The related application shows a power control circuit for a semiconductor laser diode which has a write power circuit and a read power circuit and which can provide an intermediate pedestal power output level using the write power source and a control circuit.

BACKGROUND OF THE INVENTION

The present invention relates to a power control system for a semiconductor diode laser. Such a power control system is necessary to ensure that the power supplied to a diode laser is at a consistent, predetermined level both for the application to which the laser is being applied, as well as to optimize the operating life of the laser diode. More particularly, the present invention relates to a power control circuit which may be used in an optical recording, read/write, system in which the laser diode must be controlled at two separate operating power levels at different points of operation.

U.S. Pat. No. 4,166,985, issued Sept. 4, 1979, describes a system for controlling a semiconductor laser diode. The characteristics of a laser diode can change both with temperature and age as well as other possible variables of operation. The patent shows that a controlled bias current circuit, as well as circuitry to control pulses generated by the laser, are useful for prolonging life and optimizing output. The present invention is different, however, in that two different power levels of laser output must be maintained, the read power level and the write power level. Also, the characteristics of generating a higher powered write pulse power level are different when the initial condition consists of a laser read power level than the case shown in the patent, where the initial condition is a bias current and a non-laser condition.

U.S. Pat. No. 4,277,846 shows a laser power control system in which the light output of a laser is monitored by a control system which thereafter controls the laser to operate within certain limits. However, this control circuit does not concern itself with the problem of operating a laser light source between two separate laser power levels, but concerns itself with the problem of the power level between an on condition and an off condition.

U.S. Pat. No. 4,307,469 contains a low pass filter which makes the circuit slow to respond in changes in laser power output level for control purposes. In addition, this circuit deals with average power levels rather than the power level in pulses. The present invention deals with the need to control both a continuous read power laser level, as well as the power output in write pulses. In particular, the problem of dealing with the power level in write pulses is to provide a consistent pulse output characteristic even though the characteristic of the laser diode will change due to aging. The present invention relates to a need for analyzing power levels in short duration pulses, which would not be met in this patent.

U.S. Pat. No. 4,319,203 shows another system of providing a current control for a semiconductor laser diode. Again, this circuit contains low pass filters which make the circuit slow to respond to changing conditions and in particular, create a situation in which it would not respond well to changing power levels between the first and second power level at which the laser diode is operated. In addition to which, the bias current in this patent is not controlled as a function of the pulse frequency, and thus will drift away from the established value if there are no pulses at all. The circuit of the present invention must work properly to retain the predetermined write power level even if there is a zero duty cycle or short duty cycle at the write power level. That is, the present invention avoids drifting away from the predetermined values, unlike the patent.

U.S. Pat. No. 4,399,566 shows another circuit for controlling the power applied to a laser diode. Similarly, this patent deas with the mean power level of a laser diode and does not immediately operate at the predetermined power level and is slow to respond to changes and operating conditions which would affect changed requirements to meet the predetermined power levels.

U.S. Pat. No. 4,122,409 shows a laser power control system in which laser power may be controlled at different levels. While it mentions that digital control signals may be used (col. 5, line 35), it does not show the use of independent digital stepping switches to maintain the same effective power output level of multiple levels or a normalizing converter so that all power levels are converted to a standard level for monitoring purposes.

The present invention operates a laser source at two different predetermined power levels, one of which may be a relatively continuous duty cycle and the other of which may be a relatively short or zero duty cycle, and can also quickly make necessary adjustments to control both duty cycle power levels within predetermined limits.

SUMMARY OF THE INVENTION

The present invention provides a power control system for a semiconductor diode laser which may operate at two different laser power levels. The first power level may be a relatively lower level suitable for a read level in an optical recording system. The read level in an optical recording system is a relatively continuous level when the system is in use. The second level is a relatively higher light level which is normally pulse controlled and comparatively intermittent in operation of an optical recording system. The system uses a sensing diode to detect the emissions from the laser diode and the output of the sense diode is provided to a current voltage converter switch. This current voltage converter switch receives an input signal coincident with the switching of the laser diode back and forth between the read power level and the write power level. The output of this switch is switched between a comparator circuit for the read power level and a sample and hold amplifier and comparator circuit for the write power level. This power level is stored in separate digital registers as a digital value for both the write power level and the read power level. The outputs of the digital registers for both read and write are provided to separate D/A converters, which are associated with the write current source and the read current source, so that the power level is stepped-up if the comparator determines it to be insufficient and stepped-down if the laser output power is determined to be too high. The circuits signal if there is a power-too-low condition, indicating that the laser is wearing out, or a fail condition within the power control loop exists.

This invention provides improvements with respect to the prior art in that it is usable in digital optical recording where a semiconductor laser is used between two power levels, rather than just at a single power level. Significantly, the circuit has two totally independent power control circuits for read power which is essentially a continuous direct current, and the write power level which is a pulsed power level. The circuit is provided with an adjustable pulse width control for the laser write pulse. The control system functions accurately, independently of the particular code with which the laser is driven, and the duty cycle that occurs between write level and read level. The circuit operates fast with no significant time delays, so that it accurately reads the write power levels at write power pulses. The circuit has a memory function which remembers the direct current and pulse power write level when the laser current is shut off or when pulsing is inactive. This makes it possible to re-start laser operation at the previous power level after an indeterminate time period. The circuit uses an additional photodiode emission sensor to protect against malfunctions of the primary detector diode that provides the input to the control system. Finally, the circuit is able to detect aging of the laser by the fact that the current level is increased to its maximum value, while power output of the laser diode is decreased to a certain limit. Experience indicates that this significant change means that the laser diode is shortly about to fail completely.

IN THE FIGURE:

FIG. 3 is a second embodiment of a sample and hold circuit as used in the present invention.

FIG. 4 shows the operating range characteristics of a laser diode.

DESCRIPTION OF THE PREFERRED EMBODIMENT

In a digital optical recorder a semiconductor laser is used for reading information from a disc. The same laser diode is often used for writing data on that disc. Of course, it is very important to keep both the read energy and the write energy within certain boundaries or, in the ideal case, at a constant level.

The power-current characteristic of a laser diode contains a knee which represents the so-called laser threshold. The laser is in proper and fast operation above this threshold level. The threshold level will shift to require increasing power and current with increasing temperature. The aging effect of a laser diode may cause both the threshold level and the characteristic slope in the laser operating region to change. Therefore, the control circuit needs to have an independent laser power control loop for read level, which is slightly above the threshold, and for write level.

Figure 1:
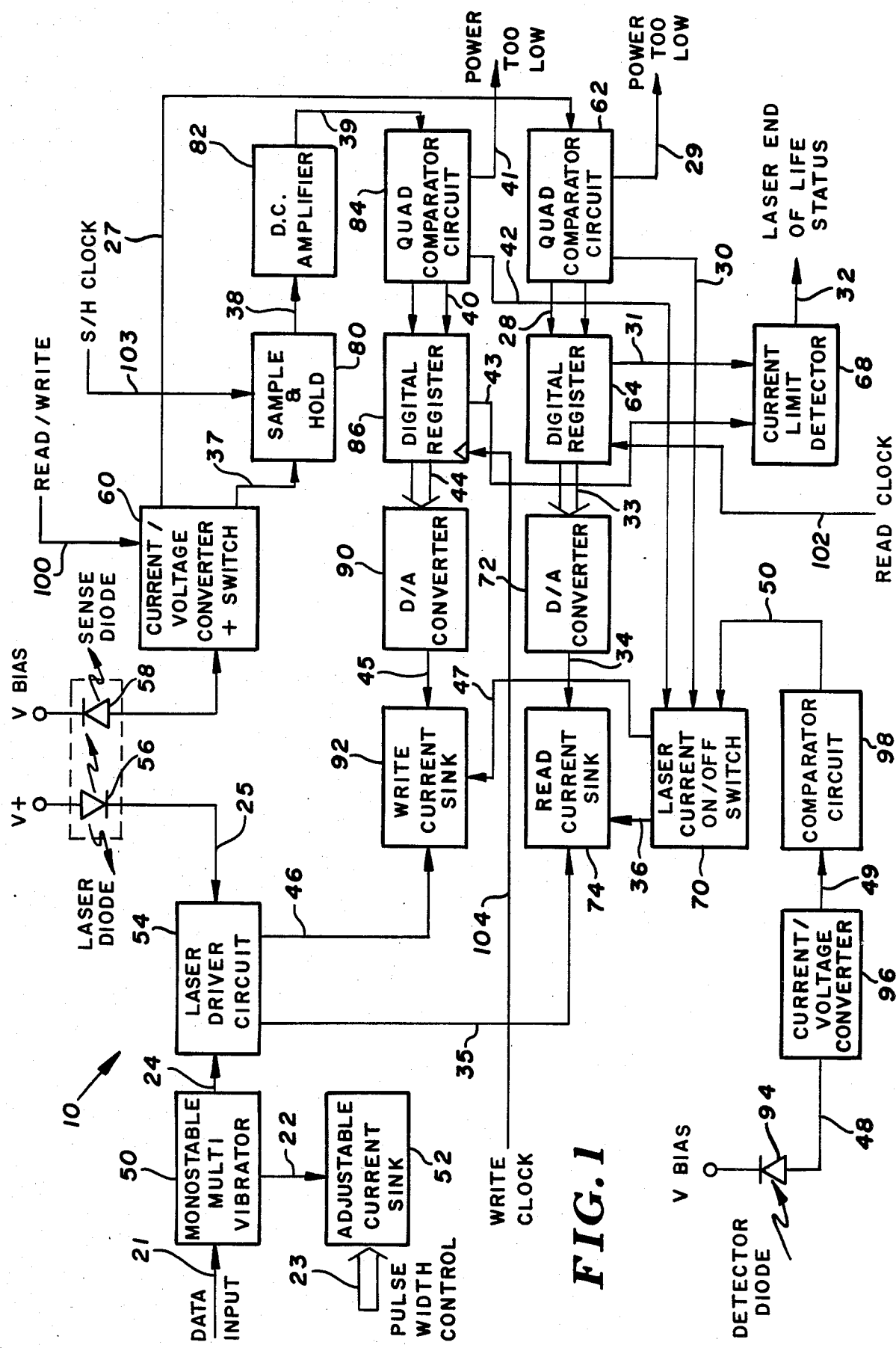
FIG. 1 is a schematic diagram of a laser power control system according to the present invention.

FIG. 1 shows a block diagram of a laser power control circuit 10 according to the present invention. The serial data stream of a desired code format 21 is sent to a monostable multivibrator 50 which has an external pulse-width control 22. The pulse width is controlled by a current sink 52 which is adjusted by a digital input 23. This feature makes it possible to use a fixed disc rotational speed on an optical recorder. By changing the pulse width in different bands between inner and outer radius of the disc because the linear track velocity varies while rotational speed is constant, it is possible to burn the same hold size during writing. The output 24 of monostable multivibrator 50 is tied to a laser driver circuit 54 which switches the laser current 25 for the laser diode 56 between the read and write mode.

A high-speed sense diode 58, which is responsive to very short pulses with fast rise times, monitors the laser output power and converts the power into a current 26. This high speed sense diode may be mounted in the laser diode package. Also a separate photo diode may be used. The sense-diode current 26 is fed into a current to voltage converter and switch circuit 60. This switch switches between read and write mode, using a signal 100 synchronous with the data input signal 21. This signal can be switching at the same speed as the data pulses or can be a window which has one fixed level during a writing operation and another fixed level during reading.

The read output 27 of switch 60 is tied to a quad comparator circuit 62. A quad comparator is a commercially available device that allows comparison of an input value with four predetermined values. The output indicates whether the input is higher or lower than the predetermined values. Circuit 62 checks the incoming signal against four different reference values as shown in FIG. 4. As long as the read output value lies within window 1-2, the circuit takes no action. If the measured signal goes outside window 1-2 but stays within window 3-4, an increment/decrement signal 28 is given to digital register 64, which is updated using read clock 102. If the signal drops below level 4, a warning signal 29 is given, indicating that the laser power is too low. If the signal goes above level 3, a protection signal 30 will turn the laser current off by means of switch 70. This is done because a too high power level might destroy the laser diode and, in case of optical recording, previous written data on the disc might be damaged or destroyed.

The digital register 64 stores a digital value which represents the analog read current of the laser diode. When aging of the laser occurs, the read current and thus its digital value will be increased. Every time the measured value drops below comparator level 2 (see FIG. 4) an increment pulse is given to register 64 to increase the drive current applied to laser diode 56. At a certain point in time as the laser ages, register 64 will reach its maximum value and an output 31 will trigger a current limit detector 68. Detector 68 will give a warning signal 32, indicating that the laser diode is reaching its end of life. When this happens, the laser diode is still usable because it still operates in the valid operating region. The laser is determined to be out of specification when the measured value in this case drops below level 4, shown in FIG. 4 and which is a predetermined value set in quad comparator 62. The importance of the laser end of life status 32 lies in the fact that it is a pre-indication of an event that is going to happen soon so that maintenance can be performed before failure occurs. This means that, for optical recording, read or write actions are not interrupted but can be ended in a normal way before the unit needs to be serviced.

The digital value 33 of register 64 is converted into an analog value 34 by means of a digital to analog converter 72. This analog value 34 controls the read current sink 74 which supplies the read current 35 for the laser driver circuit 54. The read current sink 74 can be turned off by means of signal 36 from switch circuit 70.

The write current loop is very similar to the read current loop. The write-output 37 of switch 60 is sampled and stored in a sample and hold circuit 80. This can be a common type of sample and hold circuit, using a sample clock signal 103, or a self-sampling sample and hold circuit, using the input signal 37 as a clock signal. The latter eliminates possible problems with electrical and/or optical delays in the system. Sample frequency is the same as the pulse frequency. The output 38 of the sample and hold circuit 80 is tied to the input of a DC-amplifier 82, which output 39 is connected to a similar quad comparator network 84 as in the read power loop. This comparator network again checks for four different levels as indicated in FIG. 4. Its increment/decrement outputs 40 are tied to a digital register 86, which is updated using write clock 104. Again a power too low indication 41 is provided as well as a power too high signal 42 which controls the laser current on/off switch 70.

Similar to the read power loop digital register 86 has a maximum value indication 43 connected to current limit detector 68 which provides the laser end of life status 92. The digital outputs 44 of register 86 are connected to digital to analog converter 90. The analog output 45 of converter 90 senses the write current sink 92 which supplies the write current 46 for laser driver circuit 54. Signal 47 from the current switch 70 can turn the write current sink 92 off.

The final part of the circuit is formed by an additional protection circuit against an over power condition. Maybe the worst thing that can happen to a data storage system is destroying user data. In an optical recording system, previously written data can be destroyed if the laser diode operates at a too high power level, even when it is in the read mode. The described control-loop circuit protects against this but it relies, of course, on proper operation of all its components. To be protected against malfunction or degradation of one or more components in the control loop, a second protection circuit is used. A second photo or detector diode 94 is used to measure the output power of laser diode 56. Photodiode 94 may measure a separate part of the laser beam or, as can be done in optical recording, it may be the same diode as is used for reading the data on the disc by means of the reflected light.

The current 48 of detector diode 94 is fed into a current to voltage converter 96. The output voltage 49 of this converter is compared with a reference voltage in comparator circuit 98. If the measured signal goes above this reference level, output 50 of the comparator will turn the laser currents off by means of switch 70.

Figure 2:
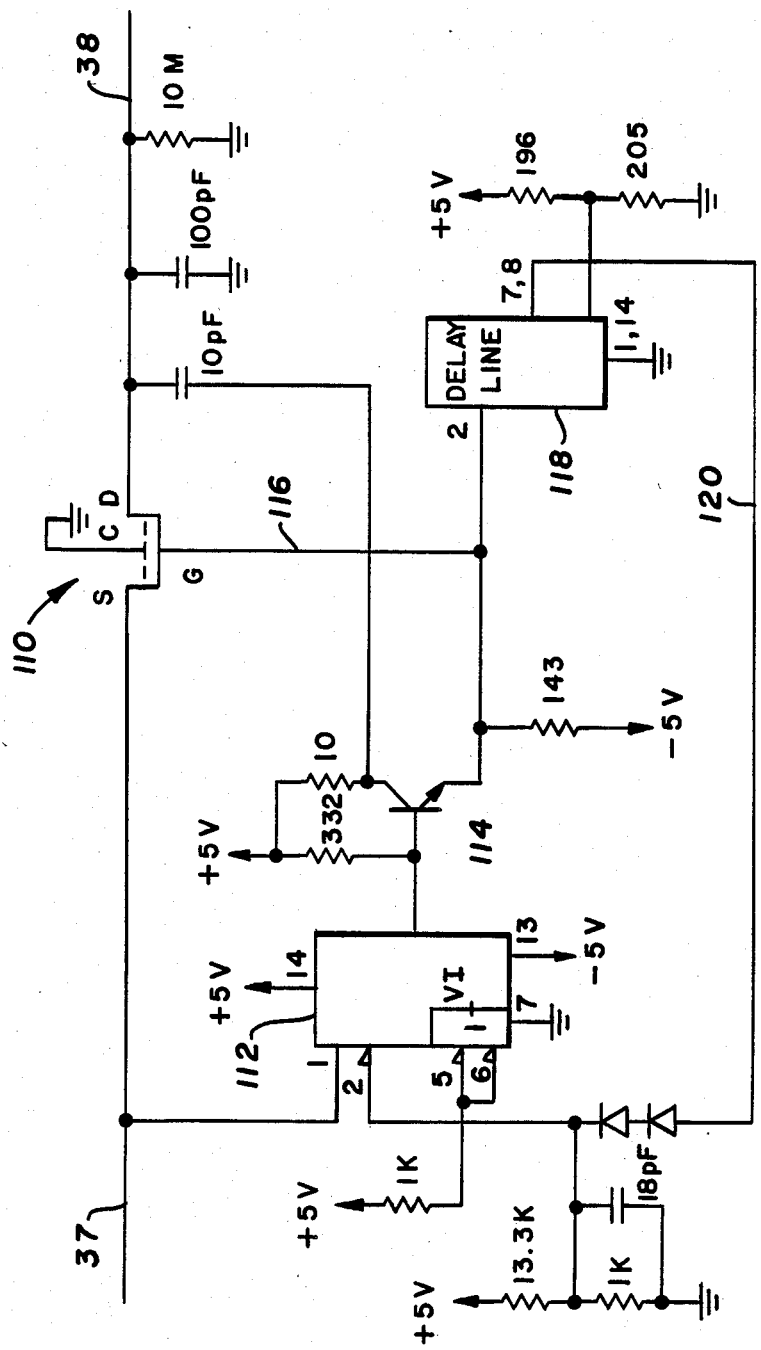
FIG. 2 is a schematic diagram of a first embodiment of a sample and hold circuit as used in the present invention.

Referring now to FIG. 2, a self sampling sample and hold circuit is shown which may be used with the invention as shown in FIG. 1. Signal line 37 coming from the current to voltage converter and switch 60 is shown at the upper left-hand corner of the figure and output line 38 is shown at the upper right-hand corner of the figure. A conventional sample and hold logic circuit containing a sample and hold gate 110 is used as the sample and hold element. A comparator 112 has a first input from line 37. The output from comparator 112 controls a transistor driver 114, which controls the clock line 116 for the sample and hold element 110. The output of transistor driver 114 is also connected to a delay line 118. The output of the delay line 118 is connected by signal line 120 to the second input of comparator 112. When the first pulse is received on input line 37, comparator 112 controls driver 114 to turn on the sample and hold circuit 110. After the appropriate time delay as set by delay line 118, an outgoing pulse on line 120 goes to second input of comparator 112. When the second signal is received by comparator 112, the output control for transistor driver 114 is turned off and the sample and hold holds the signal sample it has received.

Referring now to FIG. 3, a differential current switch 130 receives the signal from sense diode 58 on line 26. The read/write signal 100 switches the sense diode current 26 to output 27 in the read mode and to input 37 of the sample and hold circuit 80 in the write mode. Sample and hold clock signal on line 103 is provided to sample and hold gate 132 during the write pulse time period and the output is provided on line 38.

In the above description "read power" may be replaced by "DC-value" or "bias value,"0 while "write power" may be replaced by "pulsed power" or "pulse amplitude". This in case the circuit is used in another application than digital optical recording.

What is claimed is:

1. A power control circuit for a semiconductor laser diode comprising:
a variable current laser driver circuit adapted to be connected to a semiconductor laser diode,
write current control means connected to said laser driver circuit for controlling the current flow generated during a write mode of operation,
read current control means connected to said laser driver circuit for controlling the current flow generated during a read mode of operation,
sense diode means for detecting the optical output of a semiconductor laser diode which is connected to said laser driver circuit, where said sense diode means allows a current to flow in relationship to the optical output of said laser diode,
current/voltage converter and switch means connected with said sense diode means for producing a voltage in response to a current flowing in said sense diode means and for switching the output voltage between a read channel output and a write channel output in response to a read/write control signal,
a read channel comparator circuit connected to the read channel output of said current/voltage converter and switch means for producing an output signal indicative of whether said read channel output is within or outside of predetermined values,
read channel digital register means connected to said read channel comparator circuit for maintaining a number representative of the read current to be supplied to a laser diode and for incrementing and decrementing said number in response to output signals received from said read channel comparator circuit,
read channel D/A converter means connected to said read channel digital register means for converting said number to an analog signal and connected to said read current control means for providing said analog signal to control read current,
write channel sample and hold means connected to said current/voltage converter and switch means for holding the peak value of the output of said sense diode means during a write operation, a write channel comparator circuit connected to said write channel sample and hold means for producing an output signal indicative of whether said write channel output is within or outside of predetermined values, a write channel digital register means connected to said write channel comparator circuit for maintaining a number representative of the write current to be supplied to a laser diode and for incrementing and decrementing said number in response to output signals received from said write channel comparator circuit, write channel D/A converter means connected to said write channel digital register means for converting said number to an analog signal and converter to said write current control means for providing said analog signal control write current, whereby laser read power level is maintained within predetermined values and the laser write power level is maintained within predetermined values.

2. The circuit of claim 1 wherein said read channel comparator and said write channel comparator are each quad comparators containing four predetermined values representing the high and low levels of the normal operating range and the high and low levels of the valid operating range for read and write operations respectively and wherein increment and decrement signals are generated for said read channel and write channel digital registers at the low and high levels of the normal operating ranges respectively, and warning signals are generated at the high and low levels of the valid operating ranges.

3. The circuit of claim 1 and further comprising means for shutting off said read current control and said write current control if the power level detected by either said read channel comparator or said write channel comparator is higher than a predetermined limit.

4. The circuit of claim 1 and further comprising second sense diode means for detecting the optical output of a semiconductor laser diode, over power comparator means connected to said second sense diode means for determining if said laser diode is producing an optical output in excess of a predetermined limit and for producing an output if said predetermined limit is exceeded and laser current switch means connected to said over power comparator means and said write current control means for shutting off the write current power when said predetermined limit is exceeded.

5. The circuit of claim 1 and further comprising laser end of life status detector means connected to at least one of said write and read channel digital register means for producing a laser end of life status signal when said digital register is incremented to a predetermined upper number corresponding to an upper limit of power to be supplied to said laser diode.

6. The circuit of claim 1 wherein said write channel sample and hold means is self-sampling by performing a sample for a predetermined time period on a detected pulse.

7. A power control circuit for a semiconductor laser diode operating in a first laser mode and a second laser mode comprising:

a variable current laser driver circuit adapted to be connected to a semiconductor laser diode, first current control means connected to said laser driver circuit for controlling the current flow generated during a first mode of operation, second current control means connected to said laser driver circuit for controlling the current flow generated during a second mode of operation, sense diode means for detecting the optical output of a semiconductor laser diode which is connected to said laser driver circuit, where said sense diode means allows a current to flow in relationship to the optical output of said laser diode, current/voltage converter and switch means connected with said sense diode means for producing a voltage in response to a current flowing in said sense diode means and for switching the output voltage between a first channel output and a second channel output in response to a control signal, a first channel comparator circuit connected to the first channel output of said current/voltage converter and switch means for producing an output signal indicative of whether said first channel output is within or outside of predetermined values, first channel digital register means connected to said first channel comparator circuit for maintaining a number representative of the first current to be supplied to a laser diode and for incrementing and decrementing said number in response to output signals received from said first channel comparator circuit, first channel D/A converter means connected to said first channel digital register means for converting said number to an analog signal and connected to said first current control means for providing said analog signal to control said first current, second channel sample and hold means connected to said current/voltage converter and switch means for holding the peak vlaue of the output of said sense diode means during a second operation, a second channel comparator circuit connected to said second channel sample and hold means for producing an output signal indicative of whether said second channel output is within or outside of predetermined values, a second channel digital register means connected to said second channel comparator circuit for maintaining a number representative of the second current to be supplied to a laser diode and for incrementing and decrementing said number in response to output signals received from said second channel comparator circuit, second channel D/A converter means connected to said second channel digital register means for converting said number to an analog signal and connected to said second current control means for providing said analog signal to control said second current.

8. The circuit of claim 7 and further comprising laser end of life status detection means connected to at least one of said first and second mode digital register means for producing a laser end of life status signal when said one of said digital registers reaches a predetermined limit.

9. The circuit of claim 7 and further comprising second sense diode means for detecting optical output from said laser diode, over power comparator means connected to receive the signal from said second sense diode and for producing an output signal when a predetermined limit is reached, and switch means for shutting off power to said laser diode in response to said over power comparator means.

10. The circuit of claim 7 wherein said first and second mode comparators control said first and second mode digital registers in response to predetermined normal operating limits and produce power too low or power too high signals in response to predetermined valid operating region limits.

* * * * *

UNITED STATES PATENT AND TRADEMARK OFFICE
CERTIFICATE OF CORRECTION

PATENT NO. : 4,685,097

DATED : August 4, 1987

INVENTOR(S) : van der Put

It is certified that error appears in the above—identified patent and that said Letters Patent is hereby corrected as shown below:

In Column 2, line 21, please delete "deas" and insert --deals-- therefor.

In Column 7, line 19, Claim 1, please insert the word --to-- between the words "signal" and "control."

Signed and Sealed this

Fifth Day of April, 1988

Attest:

DONALD J. QUIGG

Attesting Officer

Commissioner of Patents and Trademarks